United States Patent [19]
Keren

[11] Patent Number: 5,160,891
[45] Date of Patent: Nov. 3, 1992

[54] SURFACE COIL ARRAY RECEIVER

[75] Inventor: Hanan Keren, Kfar Saba, Israel

[73] Assignee: Elscint Ltd., Haifa, Israel

[21] Appl. No.: 609,779

[22] Filed: Nov. 7, 1990

[30] Foreign Application Priority Data
Nov. 30, 1989 [IL] Israel .................................. 092510

[51] Int. Cl.⁵ .............................................. G01V 3/00
[52] U.S. Cl. ................................... 324/318; 324/322; 128/653.1
[58] Field of Search ............... 324/318, 322, 314, 307; 128/653 SC

[56] References Cited
U.S. PATENT DOCUMENTS

| | | | |
|---|---|---|---|
| 4,825,162 | 4/1989 | Roemer et al. | 324/318 |
| 4,881,034 | 11/1989 | Kaufman et al. | 324/318 |
| 4,973,907 | 11/1990 | Bergman et al. | 324/318 |

Primary Examiner—Louis Arana
Attorney, Agent, or Firm—Sandler, Greenblum & Bernstein

[57] ABSTRACT

Receiver circuitry for a surface coil array used in magnetic resonance diagnostic systems, said circuitry minimizes reflections and thus relaxes the prior art necessity for balancing the individual receiver channel for each array by obtaining quadrature signals from the acquired signals in processing circuitry located as close as possible process-wise to the display equipment.

6 Claims, 2 Drawing Sheets

SURFACE COIL ARRAY RECEIVER

FIELD OF THE INVENTION

This invention is concerned with magnetic resonance imaging (MRI) and/or magnetic resonance spectroscopic (MRS) systems and more particularly with the circuitry for receiving signals from an array of surface coils in such systems.

BACKGROUND OF THE INVENTION

Magnetic resonance systems acquire imaging and/or spectrographic data using strong magnets for providing large static magnetic fields. Gradient coils within the magnet are provided to "focus" the magnetic fields. The large static magnetic fields are used to magnetically align certain nucleii ("spins") of the sample being imaged, or spectroscopically studied. A radio frequency (RF) pulse is used to "tip" the aligned spins so that at least a projection of the tipped spins is in a plane orthogonal to the plant in which the spins are aligned. The tipped spins rotate or precess in the orthogonal plane at the Larmor frequency which is equal to $\gamma B/\pi$, where:

B is the strength of the static magnetic field
$\gamma$ is the gyromagnetic constant/element, and
$\pi$ is the constant 3.1416.

A decaying signal known as a free induction decay signal (FID) is generated by the rotating spins cutting lines of force in the magnetic field. The decay occurs because when the RF pulse terminates the nutated or tipped spins tend to dephase in the orthogonal plane and also tend to return to the aligned condition. It is the FID signals in one form or another that are used for imaging and/or spectroscopic purposes.

There are many types of magnets which can be used to generate the large static magnetic field; in a preferred embodiment, a superconducting magnet is used. The subject or patient is placed in the bore of the superconducting magnet for exposure to the large static magnetic field.

Radio frequency coils are used for transmitting RF pulses and/or receiving the FID signals. These coils are energized in a transmitting state with the RF pulse at the Larmor frequency.

The RF coils are either body coils wound within the large magnet, or special coils often used in addition to the body coils. Special coils are designed to be juxtaposed to particular problems of the body such as spine, limbs or the head. Surface coils are such special coils designed to be juxtaposed to particular portions of the body. Surface coils are relatively efficient due to the proximity of the probe to the body part from which data is acquired.

Notwithstanding the relatively high efficiency of the special coils including surface coils; the signal-to-noise ratio (SNR) of the acquired data remains critical because of the inherently small amplitudes of the FID signals. The SNR is decreased because, among other things, "pickup" of stray signals (noise) by the coil caused by stray capacitances and/or mutual inductances between the coils in quadrature surface coil arrangements or in surface coil array arrangements.

The SNR is also decreased because of variations in the impedance of the coil due to "loading" by the patient. Different patients have different body impedances; and, therefore, load the RF probes differently. Also, the human body is asymmetrical. Thus, the coil loading is not symmetrical which results in variations in the signals received from the coil at different locations in the body. SNR is also adversely affected by the size of the surface coil; so that when other things are equal, the larger the surface coil the smaller the signal-to-noise ratio.

A surface coil array is described and claimed in copending application Ser. No. 587,447 filed Sep. 25, 1990.

A problem with RF coil arrays used in MR systems in that the MRI system uses quadrature detection; i.e., the detection is applicable to both the dispersion mode and the absorption mode each of which are 90° apart. Another way of describing the orientation of the coils is that the quadrature detection provides real data and imaginary data. An exact balance between each of the coils is essential to prevent reflection, among other things. The equipment described herein enables a relaxation of the requirement for "exact balance", among other things.

Accordingly, it is the object of the present invention to provide circuitry to supplement a surface coil array by preventing reflection. In the prior art receiver circuitry for surface coil arrays it is necessary to spend a good deal of time in balancing the circuitry coupling the RF coil arrays to the image processing equipment to prevent unbalance between the signals received from the different individual coils of the array of coils.

BRIEF DESCRIPTION OF THE INVENTION

In a broad aspect of the present invention, circuitry for receiving signals from an array of surface coils and for processing, said received signals to provide image data is provided, said circuitry comprising means for minimizing the need to balance the circuitry to prevent reflections.

A related object of the present invention is to split the signals from the different RF coils of an array into real and imaginary parts in processing circuitry that is located as close to the image processing equipment as possible. In general, balancing is required only after the received signals are split into their real and imaginary components.

Yet another object of the invention is to multiplex the signals during processing to minimize the amount of circuitry.

The above mentioned and other features and objects of the present invention will be best understood when considered in the light of the following description of a broad aspect of the present invention made with reference to the accompanying drawings.

GENERAL DESCRIPTION

Prior art for the present invention is represented by U.S. Pat. No. 4,825,162 which describes nuclear magnetic resonance (NMR) imaging with multiple surface coils; i.e., an array of surface coils. FIG. 10 of that Patent is receiver circuitry for coupling the array to image processing means in an MRI system.

Figure 1:
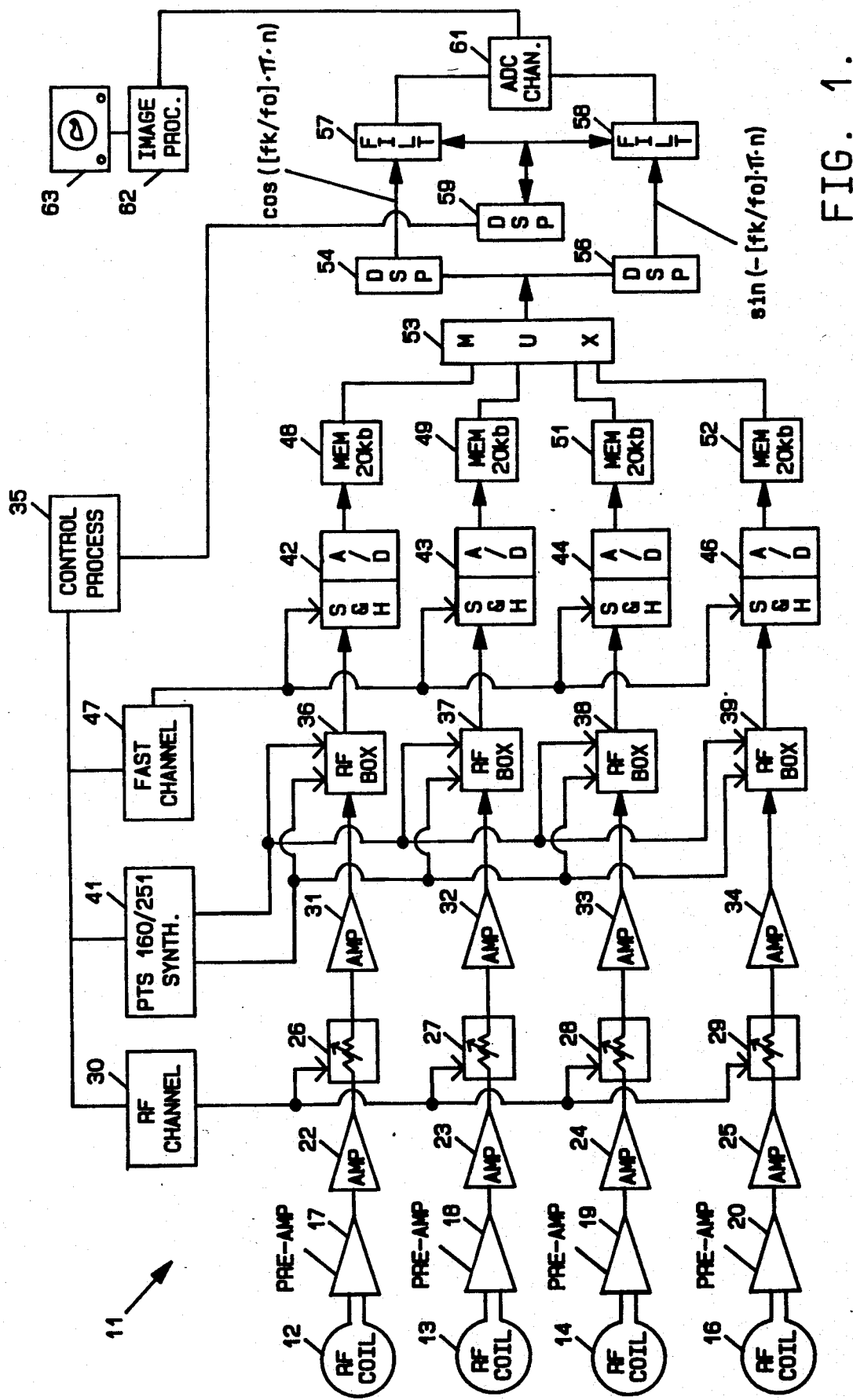
FIG. 1 is a schematic block diagram of a receiver circuitry for coupling the outputs of an array of surface coils to processing equipment.

Circuitry for receiving signals from an array of surface coils in accordance with the present invention is shown at 11 in FIG. 1 with each of the surface coils of the array coupled to the circuitry. Thus, RF coils 12, 13, 14 and 16 are each shown coupled to receiving channels that have preamplifiers 17, 18, 19 and 20, respectively. It should be noted that preamplifiers 17–20 having 50 Ohm input impedances are normally used in MRI for amplifying the FID signals received by the RF coils. Each of the preamplifiers is shown coupled to an amplifier, such that preamplifier 17 is coupled to amplifier 22, preamplifier 18 is coupled to the input of amplifier 23 and preamplifier 19 is coupled to the input of amplifier 24. Similarly, the preamplifier 20 is coupled to an amplifier 25. The signal output of each of the amplifiers is adjusted with voltage variable attenuators such as attenuator 26 attached to the output of amplifier 22, attenuator 27 attached to output of amplifier 23, attenuator 28 attached to output of amplifier 24 and attenuator 29 attached to output of amplifier 25.

The control of each of the voltage variable attenuators is exercised by a control processor unit or computer shown at 35. The computer sends control signals through an RF channel 30 for, among other things, controlling the outputs of voltage variable attenuators 26, 27, 28 and 29. The attenuators are mutually adjusted to provide maximum prorata signals to the sample and hold circuitry located in each coil channel. The voltage outputs of the voltage variable attenuators 26–29 is again amplified in the set of amplifiers 31–34, respectively attached to voltage variable attenuator 26–29, respectively.

Means are provided for obtaining a demodulated signal in the audio range from the received signals. More particularly, RF boxes 36–39 are shown connected to the outputs of amplifiers 31–34, respectively. Each of the RF boxes have three inputs comprising the inputs from the amplifiers 31–34 and two inputs from a frequency synthesizer shown at 41.

The frequency synthesizer 41 in a preferred embodiment is a PTS160/250 frequency synthesizer commercially available from Programmed Test Sources, Inc. of Littleton, Mass. The frequency synthesizer 41 is coupled to the computer 35 for control and timing purposes. The two outputs from the frequency synthesizer are:

1) a combined RF and IF output which in a preferred embodiment is in the neighborhood of 1.2 MHz, and
2) a second frequency output having frequencies of 1, 10 and 100 MHz.

The output of the RF boxes are signals of reduced frequency. The outputs of each of the RF boxes 36–39 are connected to sample-and-hold units combined with analog-to-digital converter units 42, 43, 44 and 45, respectively.

The units 42–44 and 46 each receive control signals from computer 27 through fast channel means shown at 47.

The sample-and-hold circuits sample the received signals at the output of the RF boxes. The digital signal outputs of the combined sample-and-hold analog-to-digital converters 42, 43, 44 and 46 are connected to 20 Kbite memories 48, 49, 51 and 52. These memories act as buffers for the output of the analog-to-digital portion of the units 42, 43, 44 and 46. The outputs of the memories 48–52 are connected to a multiplexer unit (MUX) 53. The output of Mux 53 is processed by digital signal processors 54 and 56. The output of digital signal processor 54 is multiplied by $\cos([f_k/f_o]\cdot\pi\cdot n)$. The output of the digital signal processor 56 is the quadrature signal $\sin([-f_K/f_o]\cdot\pi\cdot n)$; where:

$f_o$ is the Larmor frequency at the center of the magnet, and $f_k$ is the center frequency of the signal received by each coil, $(k=1, 2 \ldots n)$.

The two quadrature signals, one from each digital signal processor are sent through the digital low pass filters 57 and 58 respectively. The digital low pass filters 57 and 58 receive control signals from the computer 27 through the digital signal processor 59. The digital signal processor 59 applies Fourier transforms to the outputs of both the digital low pass filters 57 and 58. The output of both filters is sent through an analog-to-digital converter 61 which acts as a buffer for communicating with the image processor. The output of the analog-to-digital converter 61 is coupled to an image processor 62. The output of the image processor 62 is sent to display 63 where a display is provided.

Note, that it is at the point of dividing the received signal into its quadrature components that the adjustments for preventing reflection are required. In the instant case, the signal processors are as far removed from the circuit input; i.e., RF coils are possible so that circuitry adjustments for balancing the quadrature sections of the received signals are minimized.

Figure 2:
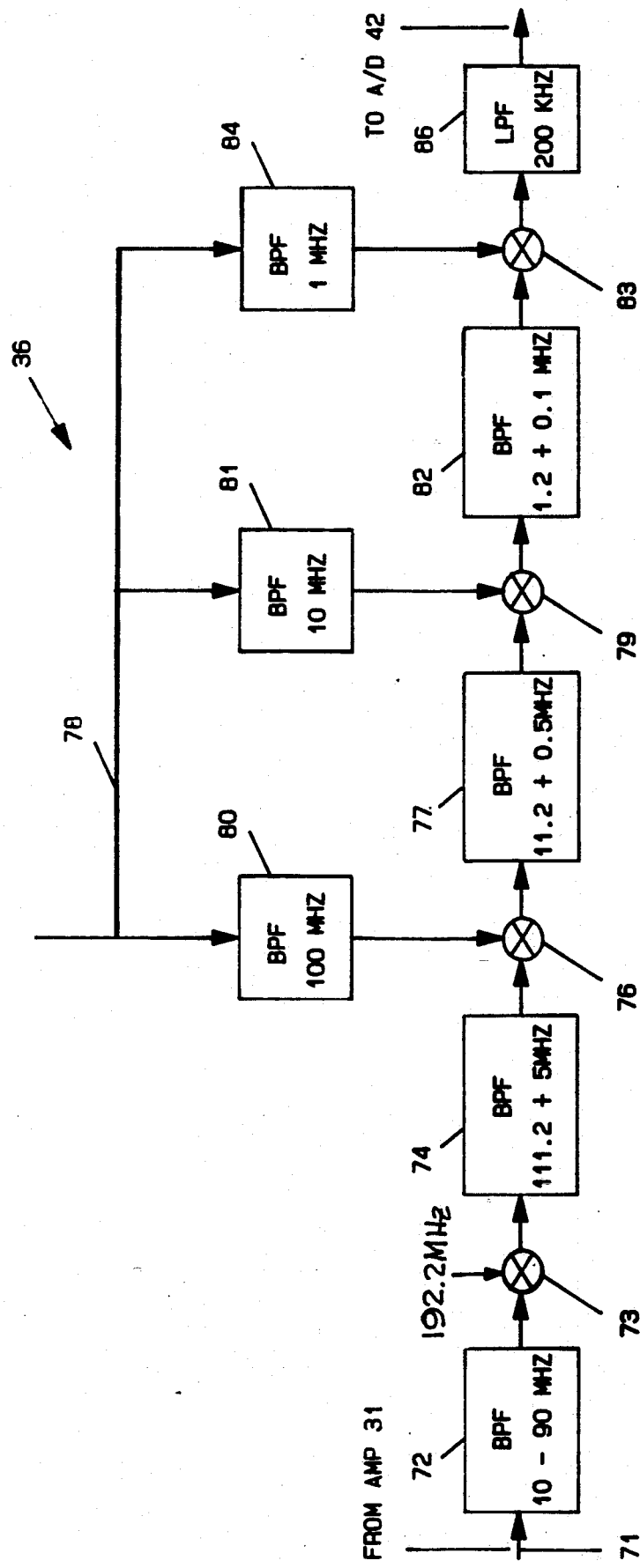
FIG. 2 is a block diagram of details of the radio frequency blocks of FIG. 1.

The details of the RF boxes 36–39 are shown in FIG. 2. Therein the details of a typical unit 36 are shown. RF box unit 36, as well as the other RF boxes, have input signals coming from the variable voltage attenuator through an amplifier such as amplifier 31 and conductor 71. The signal on conductor 71 (for example, 81 MHz) is fed into a bandpass filter which extends from 10 through 90 Mhz.

The output of the bandpass filter 72 is fed into input mixer the other input to the two input mixer 73 is the RF+IF+1.2 MHz signal or 192.2 MHz, for example. At the output of the mixer 73 upper and lower sidebands of 273.2 and 111.2 MHz are coupled to another bandpass filter 74 which extends over a range of 111.2±5 MHz. The output of the bandpass filter 74 is fed into the mixer 76. The other input to the mixer is 100 Mhz signal from synthesizer 41. The output of the mixer then is 11.2±0.5 MHz. That output is sent through bandpass filter 77 having a range of 11.2±0.5 MHz.

The 1, 10 and 100 MHz signal from synthesizer 41 is applied from conductor 78. The conductor 78 feeds into various bandpass filters shown as filters 80, 81 and 84. Bandpass filter 80, for example, enables the 100 MHz signal to be applied to mixer 76 to the exclusion of the 10 MHz and the 1 MHz signals.

The output of the bandpass filter 77 is applied to the mixer 79. The mixer 79 also receives a 10 MHz signal from the bandpass filter 81 and conductor 78. The output of mixer 79 are 21.2±0.5 MHz or 1.2±0.5 MHz signals. This output is coupled into the bandpass filter 82 with a passband of 1.2±0.1 MHz. The output of the bandpass filter 82 goes to a mixer 83.

The mixer 83 receives a second signal from conductor 78 through bandpass filter 84 which passes the 1 MHz signal to the exclusion of the 10 and 100 MHz signals. The output of mixer 83 (2.2±0.1 MHz and 0.2±0.1 MHz) then goes to a low pass filter 86 which passes signals up to 200 KHz and is coupled to sample-and-hold circuitry such as sample-and-hold circuitry 42 which samples the 200,000 Hz signal.

In practice then an array of RF coils, such as RF coils 12, 13, 14 and 16 are connected to circuitry which minimizes the amount of adjustments required to prevent reflections. This is accomplished by connecting the quadrature detecting and dividing portions of the circuitry as close to the image processing equipment as possible. The MUX circuitry is moved as far from the image processing equipment as feasible, which reduces the circuitry required. For example, placing the quadrature splitting circuits after the multiplexing equipment drastically reduces the number of such circuits required. The receiving array RF coils are fed through amplification circuits to means for reducing the frequency of the RF signal (i.e., demodulation or detecting the RF signal). The demodulating signals (audio) are sampled and converted to digital signals. The digital signals are fed through a buffer and multiplexing equipment to the processing equipment for quadraturizing the system. The split signal is filtered to reduce noise and processed for the display.

While the invention is described with reference to a certain embodiment, it should be understood that this description is made by way of example only and is not intended as placing any limitations on the scope of the invention, which scope is defined by the accompanying claims.

What is claimed is:

1. Surface coil receiver circuitry for receiving signals from an array of surface coils in a magnetic resonance system, said circuitry comprising:
   a receiver channel for each coil of said array of surface coils,
   means for preprocessing said received signals,
   said preprocessing means comprising means for converting said received signals to digital signals,
   means for multiplexing said preprocessed signals from said receiver channels,
   means for providing quadrature components only after the multiplexing by operating on said multiplexed preprocessed signals thereby minimizing the need to balance the circuitry to prevent reflections,
   display means,
   means for processing said quadrature components to provide image data, and
   means for using said image data to provide images on said display means.

2. The circuitry of claim 1 wherein said means for converting said received signals to digital signals comprise sample-and-hold means associated with each of said channels.

3. The circuitry of claim 2 wherein said means for dividing the received signals into quadrature components comprises:
   a pair of quadrature channels,
   each channel of said pair of quadrature channels comprising a digital signal processor coupled to the output of said multiplexing means,
   a first of said digital signal processors in a first of said quadrature channels providing a first quadrature signal, and
   a second of said digital processors in a second of said quadrature channels providing a second quadrature signal 90° removed from said first quadrature signal.

4. The circuitry of claim 3 including a digital low pass filter coupled to each of the quadrature channels for increasing the signal-to-noise ratio by reducing the noise.

5. The circuitry of claim 4 wherein said magnetic resonance system is a 2 Tesla system and wherein said signal preprocessing means includes means for demodulating the received signals to provide 200 KHz signals in each of said channels coupled to each of said RF coils in said coil array.

6. The circuitry of claim 5 wherein the demodulating means comprises mixers and bandpass filters to reduce the received signal frequency from approximately 110 MHz to 200 KHz.

* * * * *